US006301099B1

(12) United States Patent
Felcman et al.

(10) Patent No.: US 6,301,099 B1
(45) Date of Patent: Oct. 9, 2001

(54) COMPUTER HAVING OPTION CARD MODULE LATCHING AND DRIVE BAY PIVOT STRUCTURES

(75) Inventors: Francis A. Felcman, Rosenburg; Jerome S. Conway; Hasan Giray Kaya, both of Spring, all of TX (US)

(73) Assignee: Compaq Computer Corporation, Houston, TX (US)

( * ) Notice: Subject to any disclaimer, the term of this patent is extended or adjusted under 35 U.S.C. 154(b) by 0 days.

(21) Appl. No.: 09/060,065

(22) Filed: Apr. 14, 1998

(51) Int. Cl.[7] ................................ G06F 1/16; H05K 7/10; H01R 13/62
(52) U.S. Cl. .................... 361/683; 361/686; 312/333; 312/332.1
(58) Field of Search .................. 361/683–686, 361/724–727; 312/332.1, 333; 70/58, 59, 57; 292/DIG. 17, DIG. 30, DIG. 31, DIG. 43

(56) References Cited

U.S. PATENT DOCUMENTS

| | | | |
|---|---|---|---|
| 3,575,482 | * 4/1971 | MacMaster | 312/332.1 |
| 4,268,100 | * 5/1981 | Kekas et al. | 361/683 |
| 5,010,426 | * 4/1991 | Krenz | 361/685 |
| 5,136,468 | * 8/1992 | Wong et al. | 361/683 |
| 5,174,762 | * 12/1992 | Hoppal et al. | 439/61 |
| 5,338,214 | 8/1994 | Steffes et al. | 439/160 |
| 5,359,492 | * 10/1994 | Porter | 361/683 |
| 5,379,184 | * 1/1995 | barraza et al. | 361/685 |
| 5,566,383 | * 10/1996 | Gildea et al. | 361/685 |
| 5,745,342 | * 4/1998 | Jeffries et al. | 361/683 |
| 5,754,396 | * 5/1998 | Felcman et al. | 361/683 |
| 5,774,337 | * 6/1998 | Lee et al. | 361/725 |
| 5,784,252 | * 7/1998 | Villa et al. | 361/683 |
| 5,793,614 | * 8/1998 | Toolbom | 361/725 |
| 5,831,821 | * 11/1998 | Scholder et al. | 361/686 |
| 5,973,918 | * 10/1999 | Felcman et al. | 361/683 |
| 6,104,607 | * 8/2000 | Behl | 361/687 |

OTHER PUBLICATIONS

TorqMaster, Inc. Brochure Entitled "What Makes the First Impression?" May 1997.
EG&G Birtcher Catalogue p. 41 "Series 73, 87, 89, 92 Injector Extractors" 1995.

* cited by examiner

Primary Examiner—Leo P. Picard
Assistant Examiner—Lea Edmonds (57) ABSTRACT

A computer system is provided which includes features enhancing its serviceability. In a described embodiment, a computer has a chassis which includes option card module latching structures and a drive bay module pivot structure. The latching structures provide convenient access to a system board of the computer. The pivot structure provides convenient access to storage media devices in a drive bay module of the computer.

35 Claims, 12 Drawing Sheets

COMPUTER HAVING OPTION CARD MODULE LATCHING AND DRIVE BAY PIVOT STRUCTURES

BACKGROUND OF THE INVENTION

1. Field of the Invention

The present invention generally relates to electronic apparatus and, in a preferred embodiment thereof, more particularly relates to a computer system having enhanced serviceability.

2. Description of Related Art

Recent improvements have been made in computer serviceability. For example, in patent application Ser. No. 08/681,060, filed Jul. 22, 1996 and assigned to the assignee of the present invention, a modular desktop computer is disclosed in which an option card module is installed in a chassis of the computer in a manner enhancing the structural properties of the chassis while enhancing access to a system board or motherboard of the computer. The disclosure of that application is incorporated herein by this reference. In one aspect disclosed in the application, the option card module may be relatively easily removed from the chassis to permit convenient access to the system board.

However, it would be even more advantageous to permit convenient access to the system board without requiring removal of the option card module from the chassis. This would make servicing the system board less time-consuming, aid in preventing damage to the option card module or components thereof, and generally decrease the costs involved with assembling, disassembling and maintaining the computer. It would also be advantageous to be able to perform these operations without the need of removing fasteners, such as screws, bolts, etc.

Additionally, due at least in part to the rapid increase in capacity of storage media devices, such as hard disk drives, CD ROM's, tape drives, etc., it is becoming quite common for a computer end customer to change storage media devices, for example, to increase the hard disk drive storage capacity or to increase the CD ROM speed capacity, etc. Alternatively, such installation and/or removal of storage media devices may be performed by a computer vendor in order to customize the computer for the customer. It would, thus, be advantageous to provide a computer system in which it is convenient for the customer, vendor, etc. to exchange storage media devices or otherwise install or remove storage media devices therein or therefrom.

In the above-referenced patent application, a drive bay module is slidingly received in the computer's chassis, thereby permitting convenient access to side mountings of storage media devices and connectors at rear portions of the devices. Fasteners were utilized to secure the drive bay module within the remainder of the chassis. It would be advantageous to provide increased convenience in mounting and removing storage media devices in a drive bay module, and to do so without requiring fasteners to be installed or removed.

SUMMARY OF THE INVENTION

In carrying out principles of the present invention, in accordance with a described embodiment thereof, a computer system is provided which includes a uniquely configured chassis. The chassis includes several features which enhance serviceability of the computer.

In one aspect of the present invention, the chassis includes an option card module that is positionable relative to the remainder of the chassis through the use of novel latch structures. The latch structures both displace the option card module relative to a wall of the chassis, and permit the option card module to be retained in a position that allows removal of a system board from the chassis, without removing the option card module from the chassis, and without requiring removal of any fasteners.

In another aspect of the present invention, the option card module is selectively positionable in first and second positions relative to the remainder of the chassis. In the first position, a connector of the option card module is interconnected to a connector on the system board and the option card module prevents the system board from displacing relative to the chassis. In the second position, the option card module is displaced away from the system board, thereby disconnecting the connectors and permitting the system board to displace relative to the remainder of the chassis.

In yet another aspect of the present invention, the latch structures are uniquely configured to displace the option card module between the first and second positions. Additionally, when the latch structures have displaced the option card module to the second position, the latch structures may be locked in place, thereby preventing the option card module from inadvertently displacing back to the first position, which could cause damage to the option card module or the system board.

In still another aspect of the present invention, a drive bay module is pivotably mounted relative to a wall of the chassis. By pivoting the drive bay module outward from the remainder of the chassis, access is provided to electrical connectors and retainers for securing storage media devices within the module. A friction clutch permits the drive bay module to be pivoted a selected amount relative to the remainder of the chassis and remain in that position while the drive bay module is being serviced.

DETAILED DESCRIPTION

Figure 1:
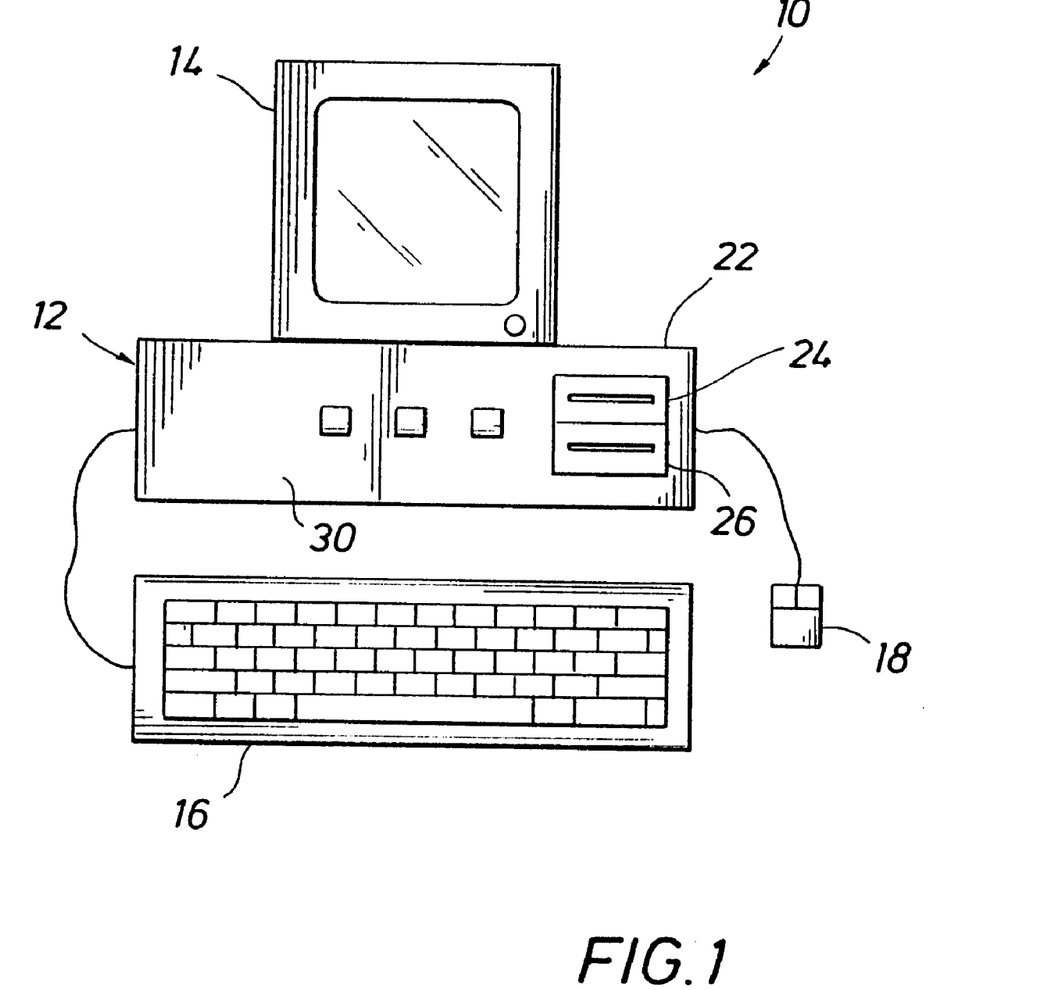
FIG. 1 is a simplified view of a computer system embodying principles of the present invention.

Representatively illustrated in FIG. 1 is a computer system 10 embodying principles of the present invention. The computer system 10 is depicted as a desktop-type computer including a CPU unit 12, a monitor 14, a keyboard 16 and a graphic input device or mouse 18. However, it is to be clearly understood that principles of the present invention may be incorporated into other types of computers and other electronic devices. For example, the computer system 10 could be a notebook or laptop computer, a tower computer, an electronic device other than a computer, etc., without departing from the principles of the present invention.

The CPU unit 12 includes a chassis 20 (not visible in FIG. 1, see FIG. 2) and a cover 22 installed on the chassis. A floppy disk drive 24, a CD ROM drive 26 and a hard disk drive 28 (not visible in FIG. 1, see FIG. 2) are operatively installed in the chassis 20, with only the floppy disk and CD ROM drives being visible through a front bezel 30 of the cover 22 when it is operatively installed. Of course, other storage media devices, other types of storage media devices, other combinations of storage media devices, fewer or greater numbers of storage media devices, etc. may be used in place of, or in addition to, the drives 24, 26, 28 described herein, without departing from the principles of the present invention.

Figure 2:
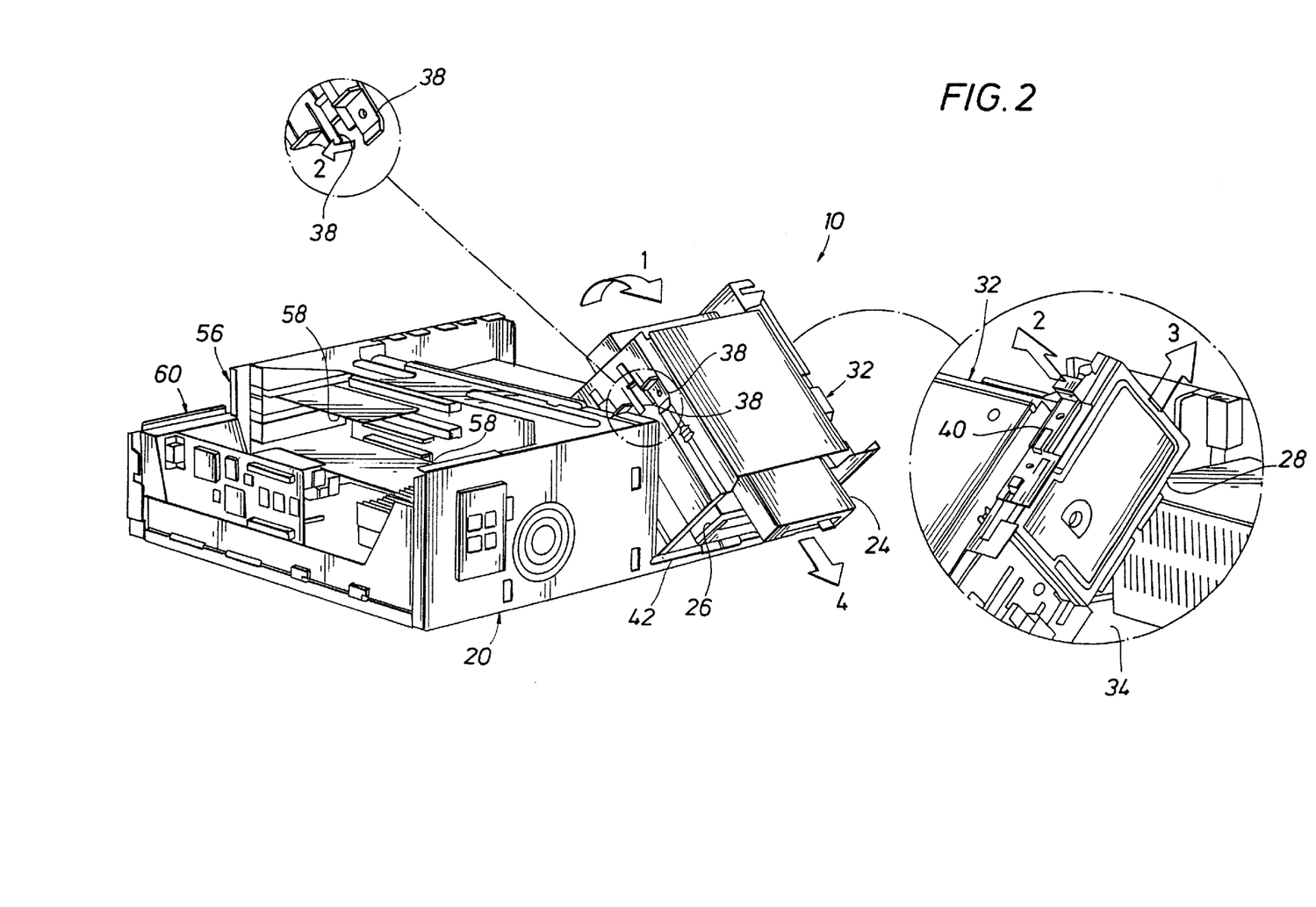
FIG. 2 is a perspective view of a CPU unit chassis of the computer system of FIG. 1, the chassis incorporating a pivoting drive bay structure and embodying principles of the present invention.

Referring additionally now to FIG. 2, the computer 10 is representatively illustrated in somewhat greater detail with the cover 22 removed therefrom. Additionally, the computer 10 is shown with a drive bay module or structure 32 pivoted upwardly and forwardly relative to the remainder of the chassis 20. The drive bay module 32 is prevented from pivoting relative to the remainder of the chassis 20 by the cover 22 when it is operatively attached to the chassis.

With the cover 22 removed, the drive bay module 32 may be pivoted relative to a lower wall 34 of the chassis 20, as indicated by the arrow labeled "1", in order to permit enhanced access to the drives 24, 26, 28 installed thereon and therein. Note that access to retaining structures or retainers 38 securing the floppy disk and CD ROM drives 24, 26 within the drive bay module 32 is blocked by an upstanding wall 36 (not visible in FIG. 2, see FIG. 8) of the chassis 20 when the drive bay module is downwardly pivoted, but access to the retainers is permitted when the drive bay module is pivoted upward as shown in FIG. 2

Another retainer 40 secures the hard disk drive 28 to a side of the drive bay module 32. The retainer 40 is in close proximity to the cover 22 when it is installed on the chassis 20, and this relationship between the retainer and the cover prevents the retainer from being inadvertently actuated to release the hard disk drive 28 when the cover is installed.

Thus, by removing the cover 22, access is provided to the retainers 38, 40. The retainers 38, 40 may then be lifted in the direction indicated by the arrows labeled "2" to release the hard disk drive 28 for displacement in the direction indicated by the arrow labeled "3", and to release the floppy disk and CD ROM drives 24, 26 for displacement in the direction indicated by the arrow labeled "4". Of course, the drive bay module 32 must be pivoted forward to gain access to the retainers 38 as described above. Forward pivoting of the drive bay module 32 also permits enhanced access to electrical connectors (not shown) at the rear of each of the drives 24, 26, 28.

Figure 3A:
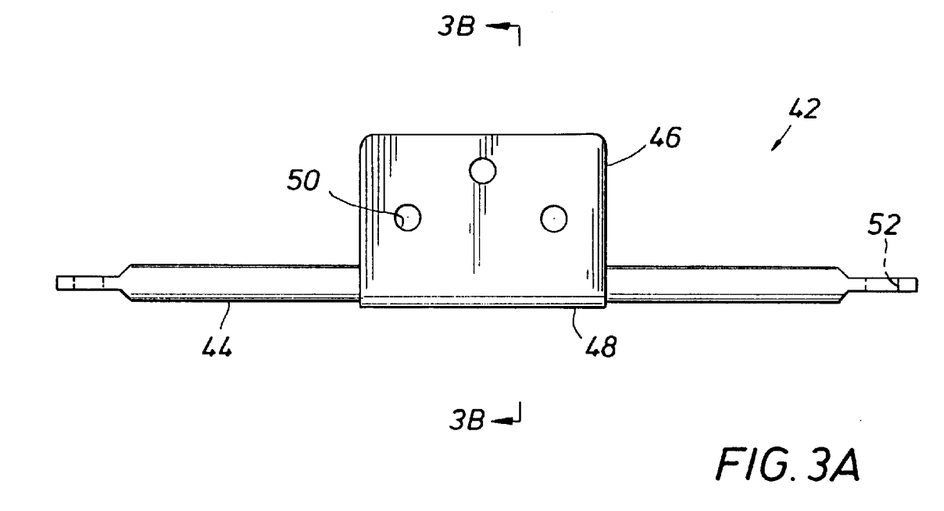
FIGS. 3A&B are elevational and cross-sectional views, respectively, of a pivot structure of the drive bay structure of FIG. 2.
Figure 3B:
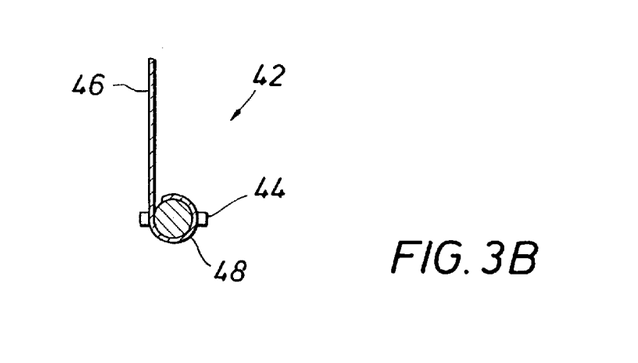

The drive bay module 32 is pivotably attached to the remainder of the chassis 20 by means of a pivot structure 42. An enlarged view of the pivot structure 42 apart from the remainder of the chassis 20 may be seen in FIG. 3A The pivot structure 42 includes a rod 44, a mounting plate 46 and a friction clutch 48. The mounting plate 46 is provided with openings 50 for attaching the pivot structure 42 to the drive bay module 32. The rod 44 is flattened at each of its ends, and openings 52 are formed through each of the ends for attaching the pivot structure to the remainder of the chassis 20. A cross-sectional view of the pivot structure 42 is shown in FIG. 3B, taken along line 3B—3B of FIG. 3A.

The friction clutch 48 is formed by inserting the rod 44 through a rolled portion of the mounting plate 46. The mounting plate 46 grips the rod 44, thereby preventing rotation of the mounting plate about the rod 44 until a sufficient force is applied to the mounting plate to overcome the friction between the mounting plate and rod. In this manner, the drive bay module 32 may be pivoted to a desired position relative to the remainder of the chassis 20 during service, without danger of the drive bay module inadvertently falling forward or backward. That is, the friction clutch 48 permits the drive bay module 32 to be pivoted a desired amount and remain there, until a sufficient force is applied thereto to pivot the drive bay module to another desired position. It is to be clearly understood, however, that other pivot structures, whether or not including friction clutches, may be utilized without departing from the principles of the present invention.

Note that in FIG. 2, an option card module 56, with option cards 58 operatively connected therein, is shown installed in the chassis 20. The option card module 56 is interconnected to a system board module 60 in the chassis 20 in a manner described more fully below.

Figure 4A:
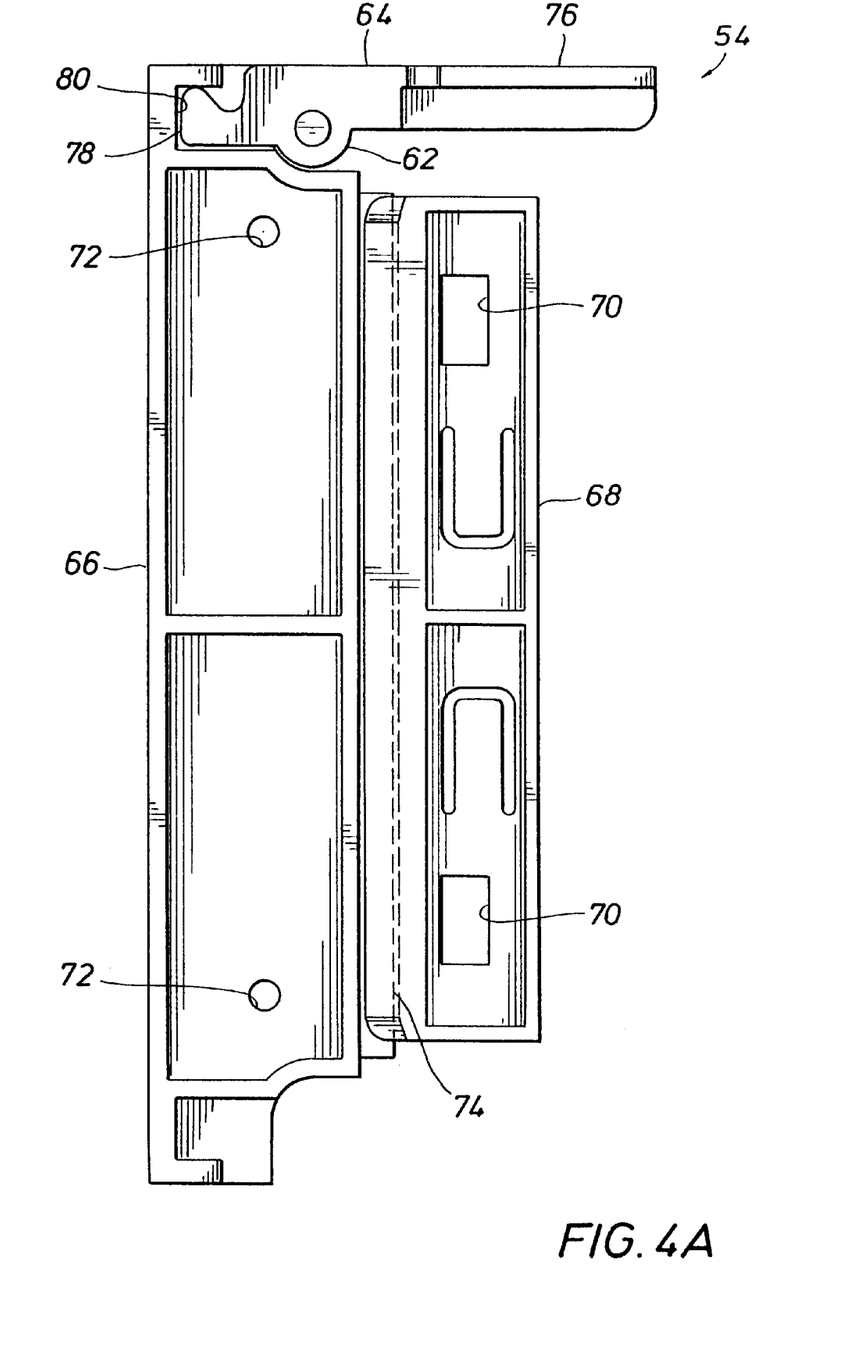
FIGS. 4A&B are elevational views of a latch structure embodying principles of the present invention, the latch structure being shown in a latched position in FIG. 4A, and in an unlatched and supporting position in FIG. 4B.
Figure 4B:
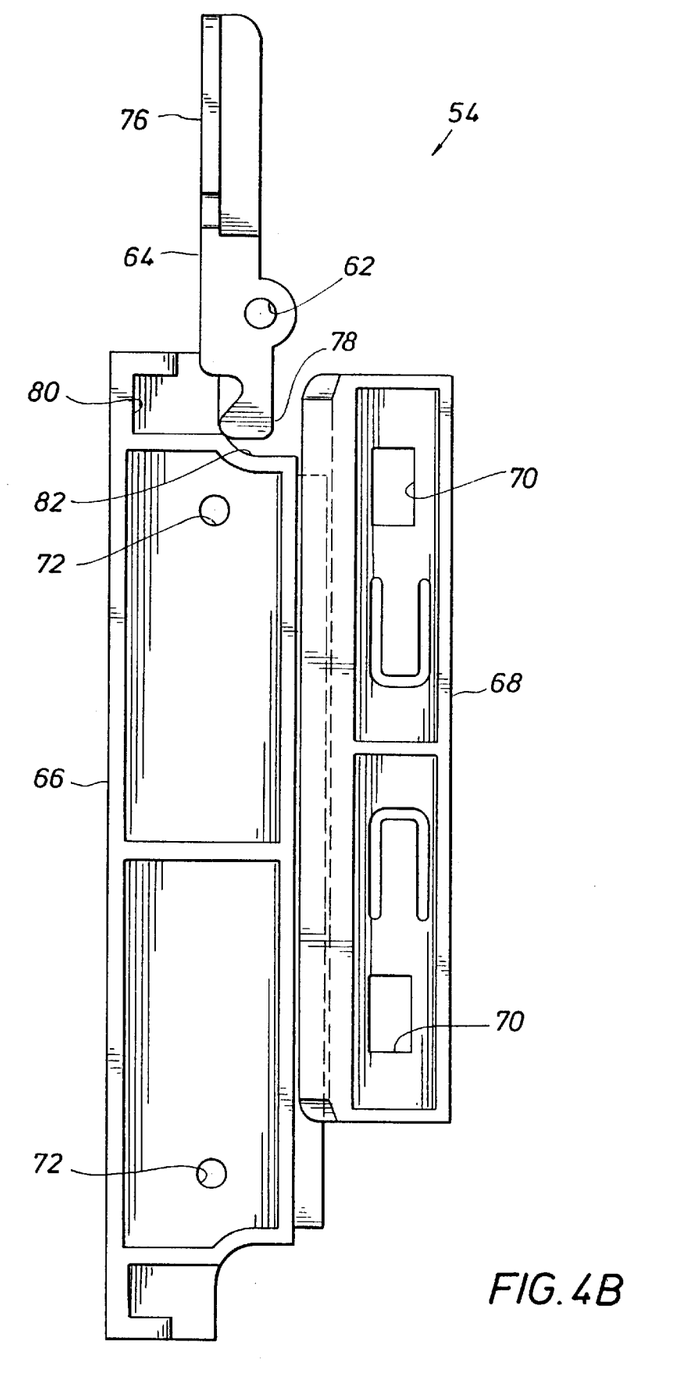

Referring additionally now to FIGS. 4A&B, a latch structure 54 embodying principles of the present invention is representatively illustrated apart from the remainder of the chassis 20 at an enlarged scale. The latch structure 54 is utilized in general to control positioning of the option card module 56 relative to the remainder of the chassis 20, and specifically to control displacement of the option card module relative to the system board module 60.

The latch structure 54 includes a pivot portion 62, a lever 64, and two guides 66, 68 When operatively installed in the chassis 20, the guide 68 is attached to the option card module 56 by means of openings 70 formed therethrough, and the guide 66 is attached to the upstanding wall 36 of the chassis by means of openings 72 formed therethrough. The guides 66, 68 have complementarily shaped elongated profiles 74 formed thereon, which permit smooth linear displacement of one guide relative to the other.

The lever 64 includes a handle 76 and an engagement portion 78. The engagement portion 78 is received within a recess 80 formed on the guide 66 as shown in FIG. 4A. As will be described more fully below, the lever 64 is pivotably attached at its pivot portion 62 to the option card module 56. The lever 64 is in close proximity to the cover 22 when it is operatively installed on the chassis 20, the cover preventing the handle 76 from pivoting upwardly about the pivot portion 62. Therefore, with the engagement portion 78 engaged within the recess 80 as shown in FIG. 4A, and the cover 22 operatively installed on the chassis 20, it will be readily appreciated that the option card module 56 is prevented from displacing relative to the wall 36 to which the guide 66 is attached.

Referring additionally now to FIG. 4B, the latch structure 54 is representatively illustrated with the handle 76 pivoted upward about the pivot portion 62. Such upward pivoting of the handle 76 has caused the engagement portion 78 to push downwardly on the recess 80, thereby displacing the lever 64 upward relative to the guide 66. Since both the lever 64 and the guide 68 are attached to the option card module 56, the guide 68 and option card module are displaced upward relative to the wall 36 along with the lever 64.

At this point, the option card module 56 is suspended by the lever 64. With the weight of the option card module 56 bearing downwardly on the lever 64, the engagement portion is engaged with another recess 82 formed on the guide 66. Note that the recess 82 is inclined laterally at the point where the engagement portion 78 is engaged therewith. The inclined portion of the recess 82 biases the engagement portion 78 to the right as viewed in FIG. 4B, that is, in a direction opposite to that in which the engagement portion must be displaced to again downwardly displace the option card module 56 relative to the wall 36. Thus, the option card module 56 is not permitted to displace downwardly relative to the wall 36 until the lever 64 is rotated clockwise as viewed in FIG. 4B with sufficient force to overcome the biasing force exerted by the recess 82 on the engagement portion 78 due to the weight of the option card module. In this manner, the option card module 56 is prevented from inadvertently displacing downwardly relative to the remainder of the chassis 20. However, it is to be clearly understood that other types of latch structures and other methods of displacing and positioning the option card module 56 relative to the system board module 60 may be utilized without departing from the principles of the present invention.

Figure 5A:
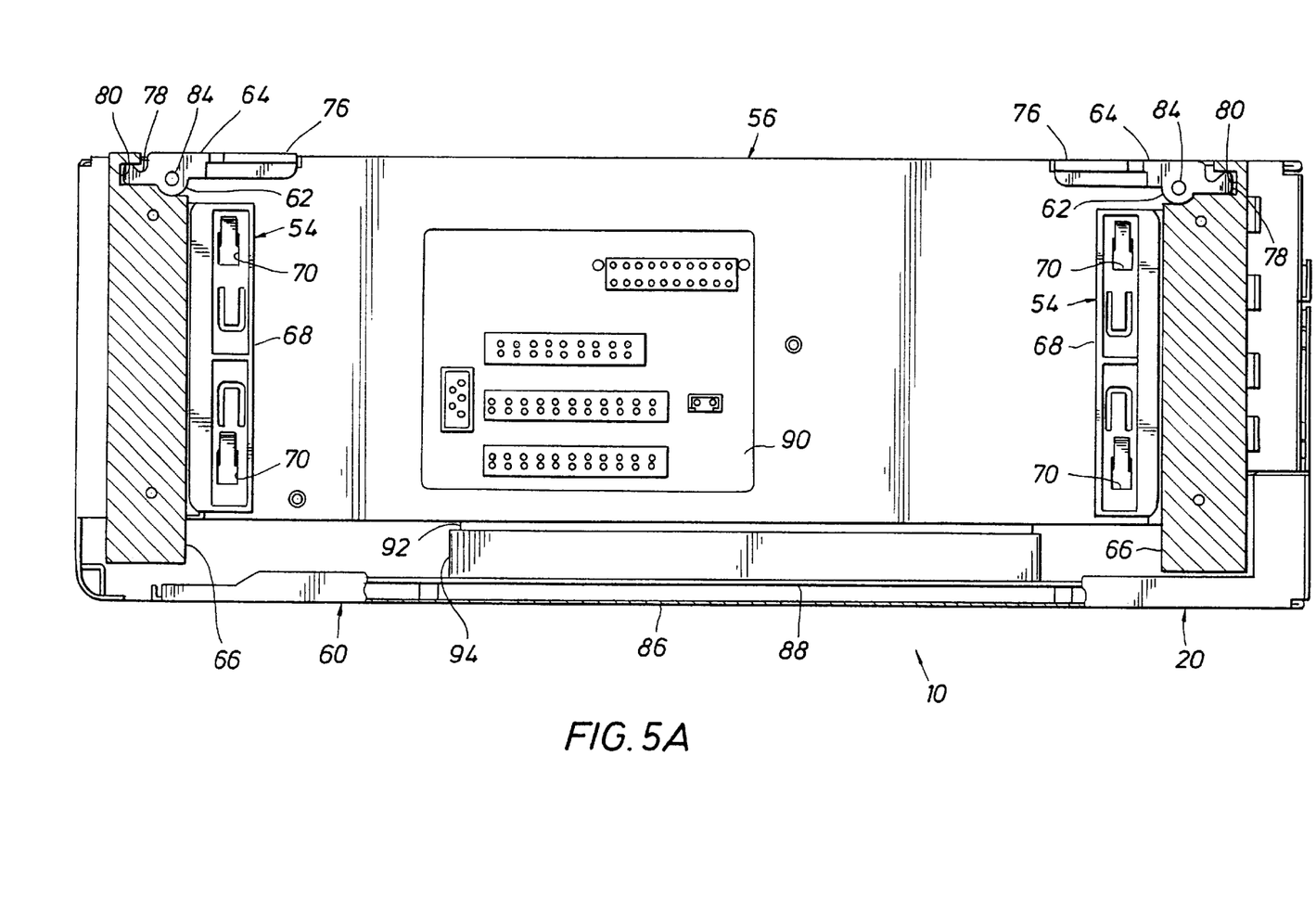
FIGS. 5A&B are elevational views taken from within the chassis of FIG. 2, showing two of the latch structure of FIGS. 4A&B operatively mounted to the chassis and an option card module within the chassis, the latch structures being shown in a latched position in FIG. 5A, and in an unlatched and supporting position in FIG. 5B.

Referring additionally now to FIG. 5A, two of the latch structures 54 are representatively illustrated installed in the chassis 20, only the option card module 56 and system board module 60 portions of the chassis being shown for illustrative clarity. As described above, the guides 68 are attached to the option card module 56 and the guides 66 are attached to the wall 36 (not shown in FIG. 5A). The levers 64 are also attached to the option card module 56 at the pivot portions 62. The pivot portions 62 pivot about pivot pins 84 installed therethrough and through the option card module 56. Note that, with the cover 22 installed, the handles 76 are prevented from pivoting upwardly.

The system board module 60 includes a tray 86 and a motherboard or system board 88 attached to an upper side surface of the tray. The system board module 60 is laterally slidably received in the chassis 20 in a manner that is more fully described below.

With the option card module 56 in its downwardly disposed position as shown in FIG. 5A, a riser card 90 of the option card module is interconnected to the system board 88 by means of card edge connectors 92, 94. As representatively illustrated, the male connector 92 is on the riser card 90 and the female connector 94 is on the system board 88, but these connectors could be oppositely mounted and other types of connectors could be utilized without departing from the principles of the present invention. Additionally, the option card module 56 prevents displacement of the system board module 60 relative to the remainder of the chassis 20 when the option card module is in its downwardly disposed position, in a manner that is more fully described below.

Figure 5B:
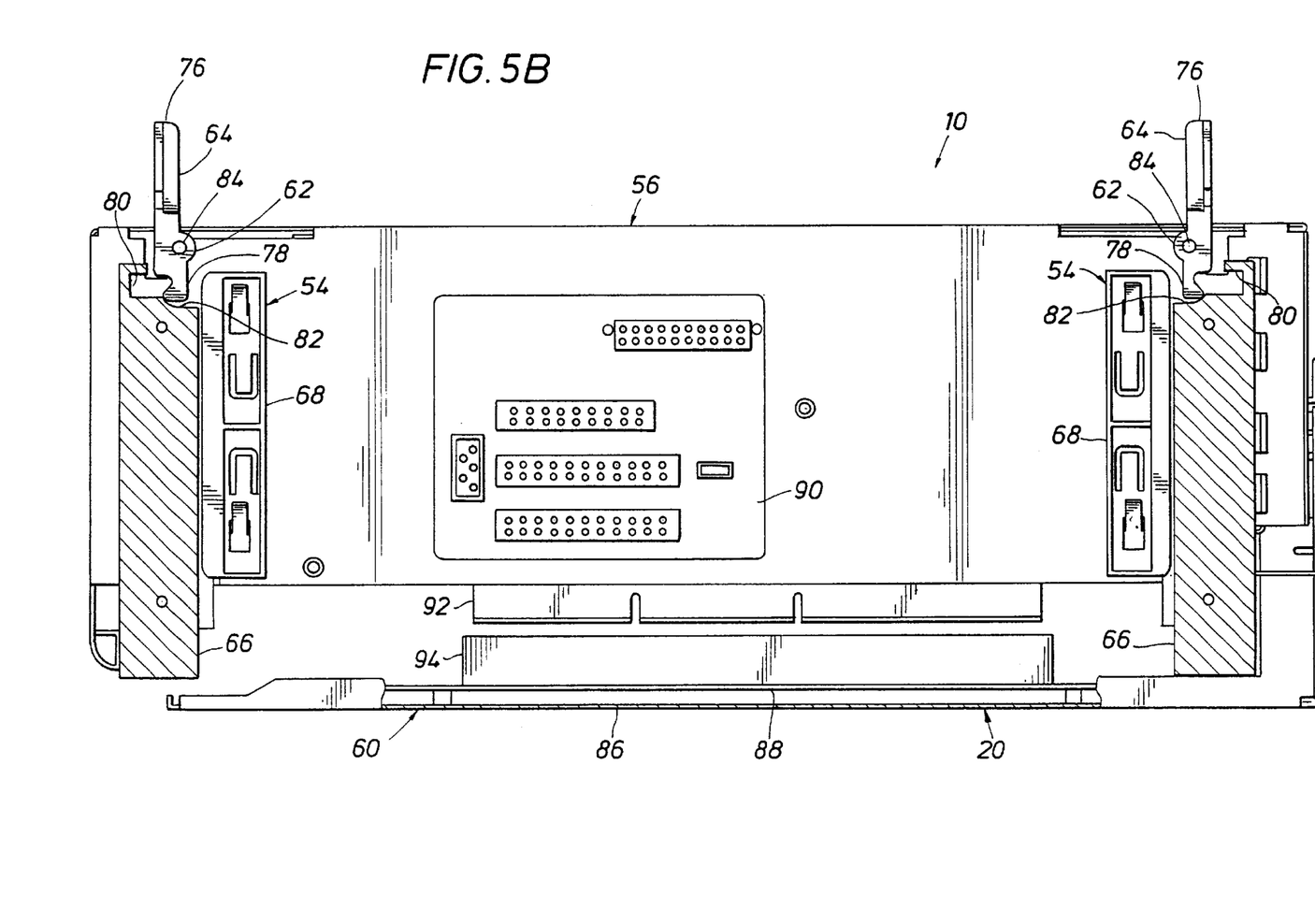

Referring additionally now to FIG. 5B, the option card module 56 is shown in its upwardly disposed position, the handles 76 of the latching structures 54 having been rotated upwardly. The connector 92 is now disconnected from the connector 94. Additionally, the system board 60 is now free to displace laterally relative to the option card module 56 and the remainder of the chassis 20. The recesses 82 prevent inadvertent rotation of the handles 76 by cooperative engagement with the engagement portions 78. Thus, the weight of the option card module 56 is used to prevent its being dropped, which could cause damage to the option card module, the system board module 60, or other portions of the chassis 20.

Figure 6A:
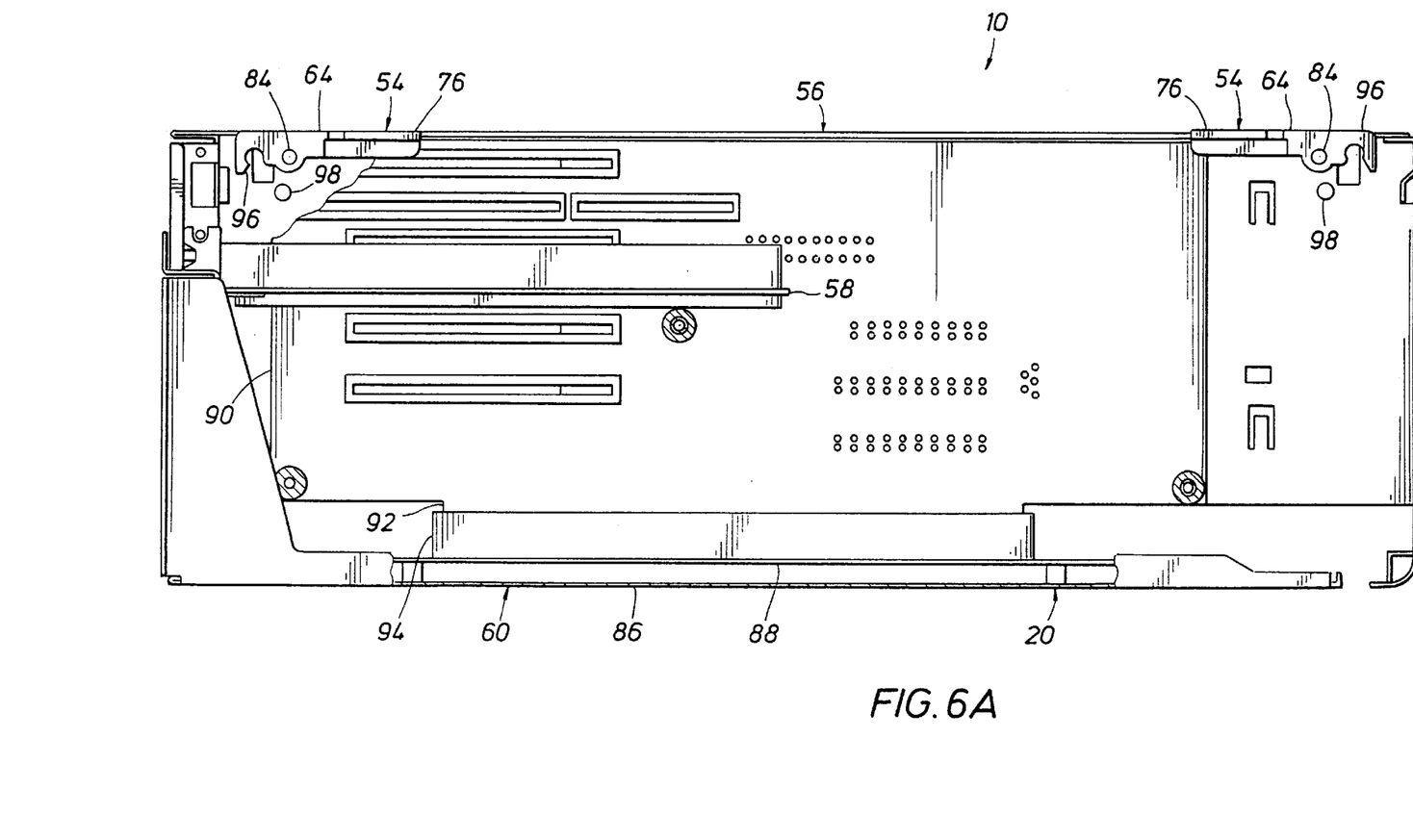
FIGS. 6A & B are elevational views taken from within the chassis, of FIG. 2, on an opposite side of the option card module as compared to that shown in FIGS. 5A&B, showing the latch structure of FIGS. 4A&B operatively mounted to the chassis and the option card module within the chassis, the latch structures being shown in a latched position in FIG. 6A, and in an unlatched and supporting position in FIG. 6B.

Referring additionally now to FIG. 6A, the option card module 56 is shown in its downwardly disposed position from an opposite side as compared to that shown in FIGS. 5A&B. The handles 76 are in their downwardly pivoted positions, maintaining the interconnection between the connectors 92, 94 and preventing displacement of the system board module 60 relative to the remainder of the chassis 20.

In this view it may be seen that a generally C-shaped lock portion 96 is formed on each of the levers 64 opposite the engagement portion 78. The lock portion 96 is shaped to complementarily engage a lock structure or pin 98 attached to or formed on the option card module 56 when the handle 76 is rotated upward to raise the option card module to its upwardly disposed position.

Figure 6B:
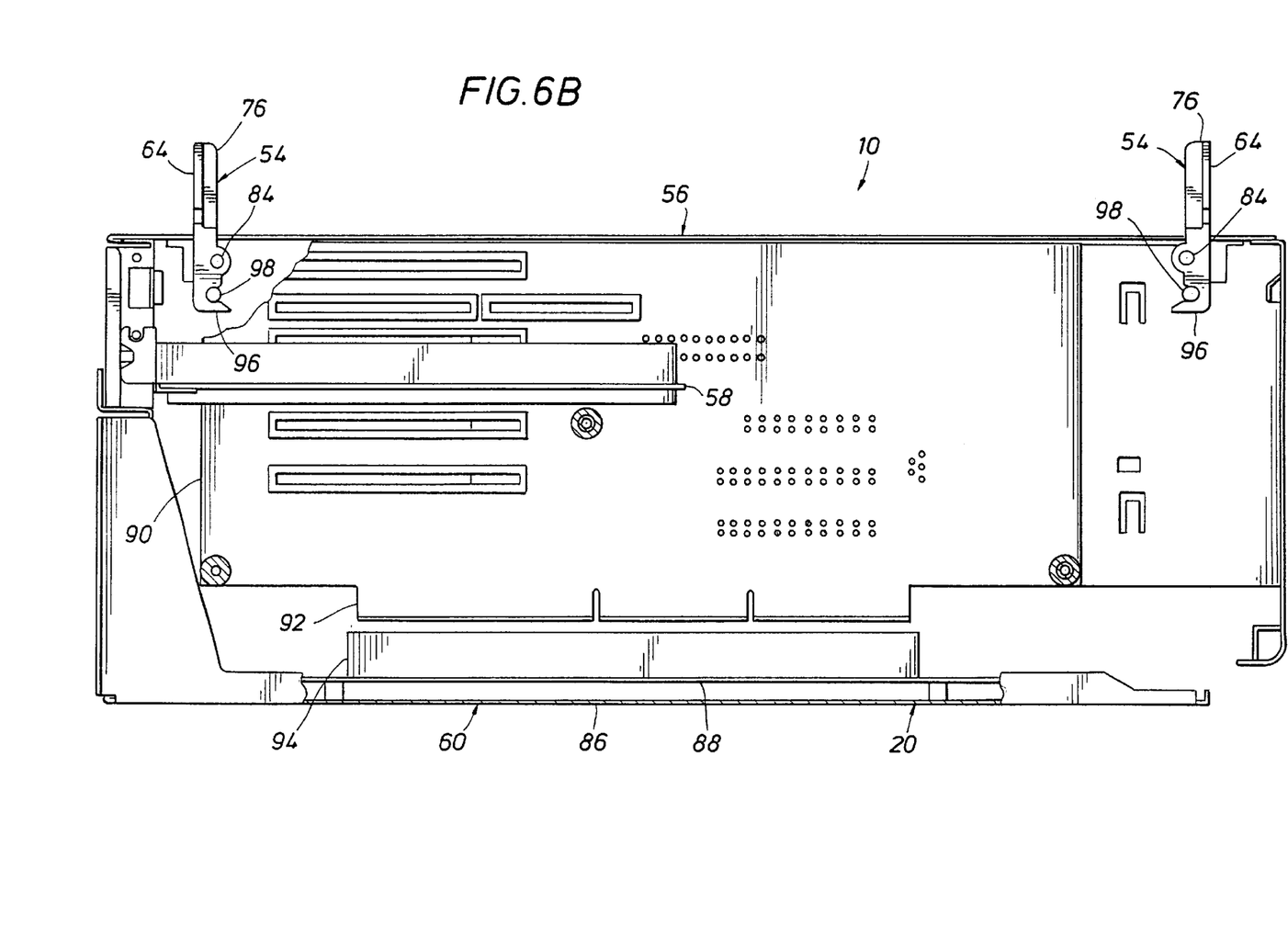

Referring additionally now to FIG. 6B, the option card module 56 is shown in its upwardly disposed position. The handles 76 have been rotated upwardly about the pivot pins 84, thereby engaging the lock portions 96 with the pins 98. Each of the lock portions 96 grippingly engages its respective pin 98 and prevents its respective handle 76 from being rotated downwardly until a predetermined force is applied to the handle to overcome the gripping force of the lock portion on the pin. Thus, the engagement between the lock portions 96 and the pins 98 provides additional assurance that the option card module 56 will not be downwardly displaced relative to the remainder of the chassis 20 until it is desired to do so.

Figure 7A:
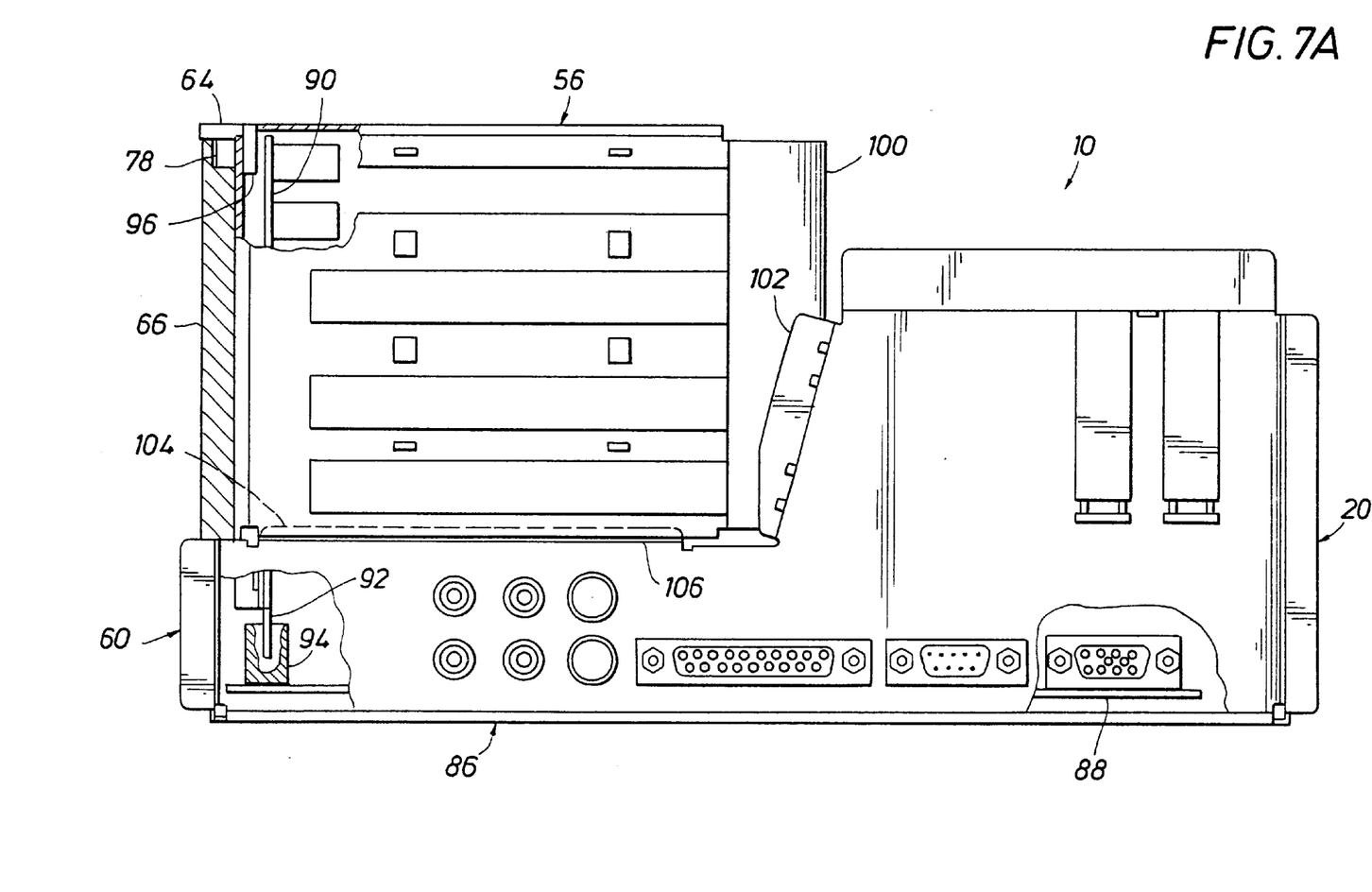
FIGS. 7A&B are rear elevational views of the chassis of FIG. 2, showing an interconnection between the option card module, a tray and a system board or motherboard mounted to the tray, the latch structures being shown in a latched position in FIG. 7A, and in an unlatched and supporting position in FIG. 7B.

Referring additionally now to FIG. 7A, the option card module 56 is shown in its downwardly disposed position, from a rear view thereof. In this view, the manner in which the option card module 56 selectively permits and prevents displacement of the system board module 60 relative to the remainder of the chassis 20 may be clearly seen. A rear upstanding wall portion 100 of the option card module 56 is disposed inwardly adjacent a laterally inclined upstanding rear wall portion 102 of the tray 86. Thus, the tray 86 is prevented from displacing forwardly relative to the remainder of the chassis 20.

Figure 7B:
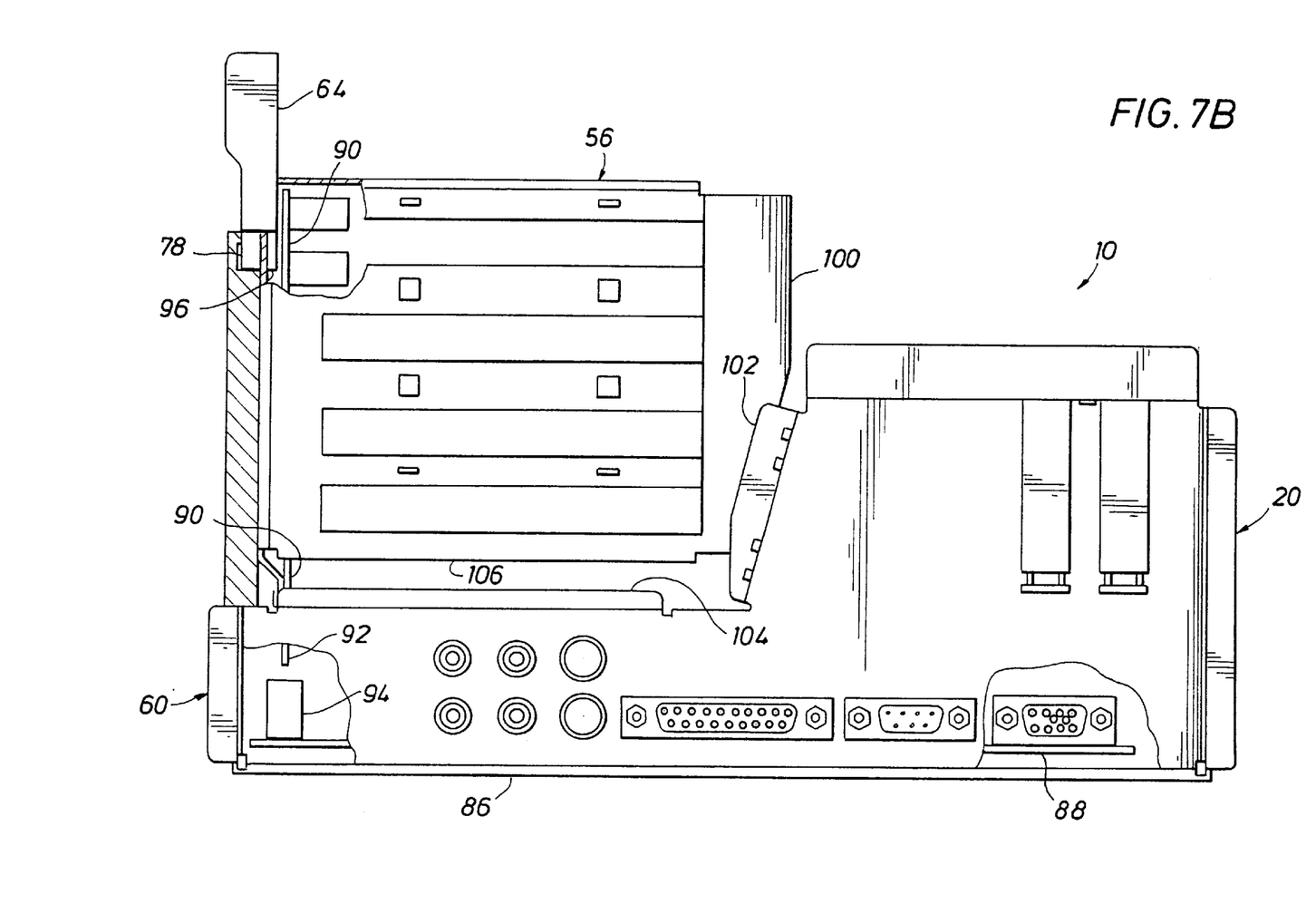

Referring additionally now to FIG. 7B, the option card module 56 is shown in its upwardly disposed position. It may now be clearly seen that an upstanding wall portion 104 of the system board module 60, which was disposed inwardly adjacent a vertical wall portion 106 of the option card module 56 as shown in FIG. 7A, is now spaced apart from the wall portion 106. With the connectors 92, 94 now disconnected as well, the system board module 60 may now be slid rearwardly and out of the chassis 20. Thus, to remove the system board module 60 from the chassis 20, a user must merely remove the cover 22, rotate the handles 76 upward, and slide the tray 86 out of the chassis. It will be readily appreciated that this procedure for removing the system board module 60 may be performed quickly and conveniently, and may be performed without the need of removing any fasteners. Additionally, due to the unique latching structures 54, the option card module 56 is safely suspended relative to the remainder of the chassis 20, and may be readily reconnected with the system board module 60 when it is reinstalled in the chassis.

Figure 8:
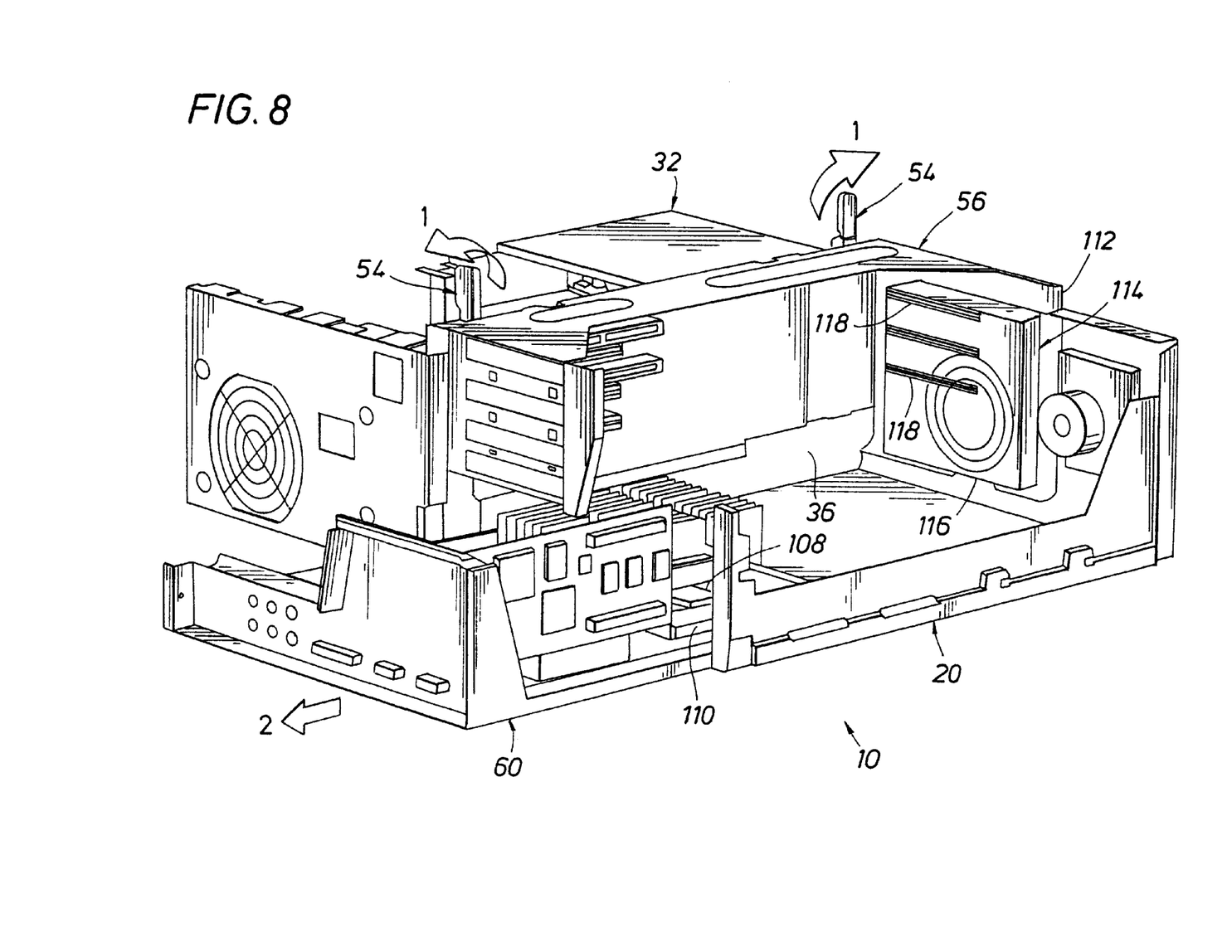
FIG. 8 is a rear perspective view of the chassis of FIG. 2, showing the motherboard and tray being removed from the chassis, with the latch structures in an unlatched and supporting position.

Referring additionally now to FIG. 8, the procedure for removing the system board module 60 is representatively illustrated. With the cover 22 removed from the chassis 20, the handles 76 of the latch structures 54 are pivoted upward as indicated by the arrows labeled "1". The option card module 56 is thereby displaced upward relative to the remainder of the chassis 20, the connectors 92, 94 are disconnected, and the option card module is disengaged from the system board module 60. The system board module 60 is thus permitted to displace laterally out of the remainder of the chassis 20 as indicated by the arrow labeled "2".

In this manner, the system board 60 may be conveniently removed from the chassis 20 for service, upgrading, etc. For example, components on the system board 88, such as a microprocessor 108, or a data storage device 110, such as RAM, operative to store data that may be retrieved by the microprocessor, may be replaced, upgraded, added, etc.

Note that a front vertical wall 112 of the option card module 56 has a fan 114 attached to a rear side surface thereof. Thus, when the option card module 56 is displaced between its upwardly and downwardly disposed positions, the fan 114 is displaced therewith. A housing 116 of the fan 114 has generally horizontally disposed linear card edge guides 118 formed thereon, so that when the cards 58 are installed in the option card module 56, the card edge guides provide support for the cards. Of course, the cards 58 must be of sufficient length to extend forward to the card edge guides 118.

The foregoing detailed description is to be clearly understood as being given by way of illustration and example only, the spirit and scope of the present invention being limited solely by the appended claims.

What is claimed is:

1. An electronic device chassis, comprising:
   least one wall;
   an option card module selectively positionable relative to the wall in first and second spaced apart positions;
   at least one latch structure, the latch structure being operative to displace the option card module between the first and second positions and releasably secure the option card module in each of the first and second positions; and
   a removable system board module to which the option card module is selectively connected and disconnected as the option card is moved between the first and second spaced apart conditions, wherein the system board module may be removed when the option card module is positioned in the second spaced apart position.

2. The chassis according to claim 1, wherein the wall is an upstanding wall, and wherein the option card module is vertically displaced between the first and second positions by the latch structure.

3. The chassis according to claim 2, wherein in the first position, the option card module is upwardly displaced relative to the wall when the option card module is displaced from the first to the second position.

4. The chassis according to claim 1, wherein the latch structure prevents downward displacement of the option card module relative to the wall when the option card module is in the second position.

5. The chassis according to claim 1, wherein the option card module includes a first connector mounted thereto, the first connector being interconnected to a second connector within the chassis when the option card module is in the first position, and the first and second connectors being disconnected when the option card module is displaced from the first to the second position.

6. The chassis according to claim 5, wherein the second connector is mounted to a circuit board disposed within the chassis.

7. The chassis according to claim 6, wherein the circuit board is slidably received in the chassis.

8. The chassis according to claim 6, wherein the circuit board is retained within the chassis by the option card module when the option card module is in its first position, and wherein the circuit board is displaceable relative to the remainder of the chassis when the option card module is in the second position.

9. The chassis according to claim 1, wherein the latch structure includes a pivot portion and a lever having a handle and an engagement portion.

10. The chassis according to claim 9, wherein the engagement portion applies a biasing force displacing the option card module from the first to the second position when the handle is rotated about the pivot portion.

11. The chassis according to claim 9, wherein the engagement portion prevents displacement of the option card module from the second position to the first position when the handle has been rotated about the pivot portion to displace the option card module from the first to the second position.

12. The chassis according to claim 9, further comprising a cover, the cover preventing rotation of the handle about the pivot portion when the cover is operatively installed.

13. The chassis according to claim 9, wherein the latch structure further includes a releasable lock portion.

14. The chassis according to claim 13, wherein the lock portion prevents rotation of the handle about the pivot portion when the handle has been rotated about the pivot portion to displace the option card module to the second position.

15. The chassis according to claim 13, wherein the lock portion engages a lock structure when the handle is rotated in a first direction about the pivot portion.

16. The chassis according to claim 15, wherein the lock portion prevents rotation of the handle about the pivot portion in a second direction, opposite to the first direction, when the lock portion is engaged with the lock structure.

17. The chassis according to claim 16, wherein the lock portion releases from the lock structure, permitting the handle to rotate about the pivot portion in the second direction, when a predetermined force is applied to the handle.

18. The chassis according to claim 13, wherein the lock structure is attached to the option card module, and wherein the pivot portion is pivotably attached to the option card module.

19. The chassis according to claim 1, further comprising a fan attached to the option card module and displaceable therewith.

20. The chassis according to claim 19, wherein the fan includes at least one card edge guide.

21. The chassis according to claim 20, wherein the option card module includes a card, an edge of the card being received in the card edge guide.

22. An electronic device chassis, comprising:
   a first wall; and a drive bay module pivotably affixed relative to the first wall; and a friction clutch to maintain the drive bay module in a selected pivoted position relative to the first wall.

23. The chassis according to claim 22, wherein the drive bay module includes at least one storage media device operatively mounted therein.

24. The chassis according to claim 23, wherein the storage media device is releasably retained within the drive bay module by a retaining structure.

25. The chassis according to claim 24, wherein the drive bay module is selectively pivotable between first and second positions, the retaining structure being inaccessible when the drive bay module is in the first position, and the retaining structure being accessible when the drive bay module is in the second position.

26. The chassis according to claim 24, further comprising a second wall disposed adjacent the drive bay module, and wherein the drive bay module is selectively pivotable between first and second positions, the second wall blocking access to the retaining structure when the drive bay module is in the first position, and the retaining structure being accessible when the drive bay module is in the second position.

27. The chassis according to claim 24, further comprising a cover, the cover preventing release of the retaining structure when the cover is operatively installed.

28. The chassis according to claim 22, further comprising a cover, the cover preventing pivoting of the drive bay module relative to the first wall when the cover is operatively installed.

29. A computer system, comprising:

a chassis including a first wall, and a drive bay module pivotably attached relative to the first wall, the drive bay module remaining secured to the first wall throughout a plurality of pivoted positions;

a microprocessor disposed in the chassis; and a data storage device secured to the chassis and operative to store data that may be retrieved by the microprocessor, wherein the drive bay module is pivoted from a first position to a second position to provide access to the data storage device for installation and removal of the data storage device.

30. The computer system according to claim 29, wherein the drive bay module includes at least one storage media device operatively mounted therein.

31. The computer system according to claim 30, wherein the storage media device is releasably retained within the drive bay module by a retaining structure.

32. The computer system according to claim 31, wherein the drive bay module is selectively pivotable between first and second positions, the retaining structure being inaccessible when the drive bay module is in the first position, and the retaining structure being accessible when the drive bay module is in the second position.

33. The computer system according to claim 31, further comprising a second wall disposed adjacent the drive bay module, and wherein the drive bay module is selectively pivotable between first and second positions, the second wall blocking access to the retaining structure when the drive bay module is in the first position, and the retaining structure being accessible when the drive bay module is in the second position.

34. The computer system according to claim 31, further comprising a cover, the cover preventing release of the retaining structure when the cover is operatively installed.

35. The computer system according to claim 29, further comprising a cover, the cover preventing pivoting of the drive bay module relative to the first wall when the cover is operatively installed.

* * * * *

UNITED STATES PATENT AND TRADEMARK OFFICE
CERTIFICATE OF CORRECTION

PATENT NO. : 6,301,099 B1
DATED : October 9, 2001
INVENTOR(S) : Francis A. Felcman et al.

Page 1 of 1

It is certified that error appears in the above-identified patent and that said Letters Patent is hereby corrected as shown below:

<u>Claim 1</u>,
Line 2, please add the word "at" before "least one wall".

<u>Claim 22</u>,
Line 2, please delete the word "and" after "a first wall".

Signed and Sealed this

Nineteenth Day of March, 2002

Attest:

JAMES E. ROGAN
*Attesting Officer*     *Director of the United States Patent and Trademark Office*